United States Patent
Padullaparthi et al.

(10) Patent No.: US 10,283,935 B1
(45) Date of Patent: May 7, 2019

(54) CONSUMER SEMICONDUCTOR LASER

(71) Applicant: Xiamen Sanan Integrated Circuit Co., Ltd., Xiamen, Fujian Province (CN)

(72) Inventors: Babu Dayal Padullaparthi, Queensway (HK); Feng Lin, Xiamen (CN)

(73) Assignee: XIAMEN SANAN INTEGRATED CIRCUIT CO., LTD., Xiamen, Fujian Province (CN)

( * ) Notice: Subject to any disclaimer, the term of this patent is extended or adjusted under 35 U.S.C. 154(b) by 0 days.

(21) Appl. No.: 15/746,273

(22) PCT Filed: Jan. 3, 2018

(86) PCT No.: PCT/CN2018/070112
§ 371 (c)(1),
(2) Date: Jan. 19, 2018

(51) Int. Cl.
*H01S 5/125* (2006.01)
*H01S 5/183* (2006.01)
*H01S 5/042* (2006.01)
*H01S 5/30* (2006.01)

(52) U.S. Cl.
CPC ............ *H01S 5/125* (2013.01); *H01S 5/0425* (2013.01); *H01S 5/18361* (2013.01); *H01S 5/309* (2013.01); *H01S 5/3054* (2013.01)

(58) Field of Classification Search
CPC ........ H01S 5/125; H01S 5/309; H01S 5/3054; H01S 5/18361; H01S 5/0425
See application file for complete search history.

(56) References Cited

U.S. PATENT DOCUMENTS

2002/0075921 A1\* 6/2002 Kitatani .............. H01S 5/18341
372/45.01
2005/0013334 A1\* 1/2005 Watanabe ........... H01S 5/18311
372/44.01

\* cited by examiner

*Primary Examiner* — Dung T Nguyen
(74) *Attorney, Agent, or Firm* — Muncy, Geissler, Olds & Lowe, P.C.

(57) ABSTRACT

A vertical cavity surface emitting laser device includes a substrate, a first-type doped distributed Bragg reflector (DBR) disposed on the substrate, a first electrode disposed on the substrate, an active layer disposed on the first-type doped DBR, a second-type DBR disposed on the active layer, and a second electrode disposed on the second-type DBR. The second-type DBR defines a first doping concentration region, and a second doping concentration region disposed between the first doping concentration region and the active layer and that has a doping concentration less than that of the first doping concentration region. The second-type doped DBR has a confinement member formed in the first doping concentration region, and defining an aperture.

17 Claims, 5 Drawing Sheets

CONSUMER SEMICONDUCTOR LASER

CROSS-REFERENCE TO RELATED APPLICATION

This is a United States national phase of International Application No. PCT/CN2018/070112, filed on Jan. 3, 2018, the content of which is hereby incorporated by reference in its entirety.

FIELD

The disclosure relates to a consumer semiconductor laser.

BACKGROUND

A vertical cavity surface emitting laser device (VCSEL) is capable of emitting a laser beam perpendicular to its top surface. There are wide applications in connection with VCSEL, such as data communication, absorption spectroscopy, optical sensor, etc.

Referring to FIG. 1, a conventional vertical cavity surface emitting laser device 900 includes a substrate 901, a bottom distributed Bragg reflector 902 disposed on the substrate 901, an active layer 903 disposed on the bottom distributed Bragg reflector 902, a top distributed Bragg reflector 904 disposed on the active layer 903, a top electrode 905 disposed on the top distributed Bragg reflector 904, a bottom electrode 906 connected to the substrate 901 opposite to the bottom distributed Bragg reflector 902, and a confinement member 907 formed in the top distributed Bragg reflector 904 and defining an aperture 908 through which a laser beam emitted by the active layer 903 passes.

When operating the conventional VCSEL 900, the top electrode 905 and the bottom electrode 906 are connected to an external power source (not shown) to provide electrical energy to the active layer 903, which then emits a laser beam 910 that oscillates between the top distributed Bragg reflector 904 and the bottom distributed Bragg reflector 902, and eventually exits the conventional vertical cavity surface emitting laser device 900 through the aperture 908 defined by the confinement member 907. Various techniques may be used for forming the confinement member 907. For instance, the top distributed Bragg reflector 904 may be partially implanted with protons or partially oxidized by high temperature to form the confinement member 907. In order not to damage the active layer 903 when forming the confinement member 907, a gap is left between the active layer 903 and the confinement member 907. However, electric current tend to leak through a portion 911 of the gap.

Therefore, it is desired to suppress such current leakage.

SUMMARY

Therefore, an object of the present disclosure is to provide a consumer semiconductor laser that can alleviate the drawback associated with the prior art.

The consumer semiconductor laser according to the present disclosure includes a substrate, a first-type doped distributed Bragg reflector, a first electrode, an active layer, a second-type doped distributed Bragg reflector and a second electrode.

The first-type doped distributed Bragg reflector is disposed on the substrate. The first electrode is disposed on the substrate. The active layer is disposed on the first-type doped distributed Bragg reflector. The second-type doped distributed Bragg reflector is disposed on the active layer, and defines a first doping concentration region and a second doping concentration region disposed between the first doping concentration region and the active layer. The second doping concentration region has a doping concentration less than that of the first doping concentration region. The second-type doped distributed Bragg reflector has a confinement member that is formed in the first doping concentration region and that defines an aperture. The second electrode is disposed on the second-type doped distributed Bragg reflector.

BRIEF DESCRIPTION OF THE DRAWINGS

Other features and advantages of the present disclosure will become apparent in the following detailed description of the embodiment with reference to the accompanying drawings, of which.

DETAILED DESCRIPTION

Figure 1:
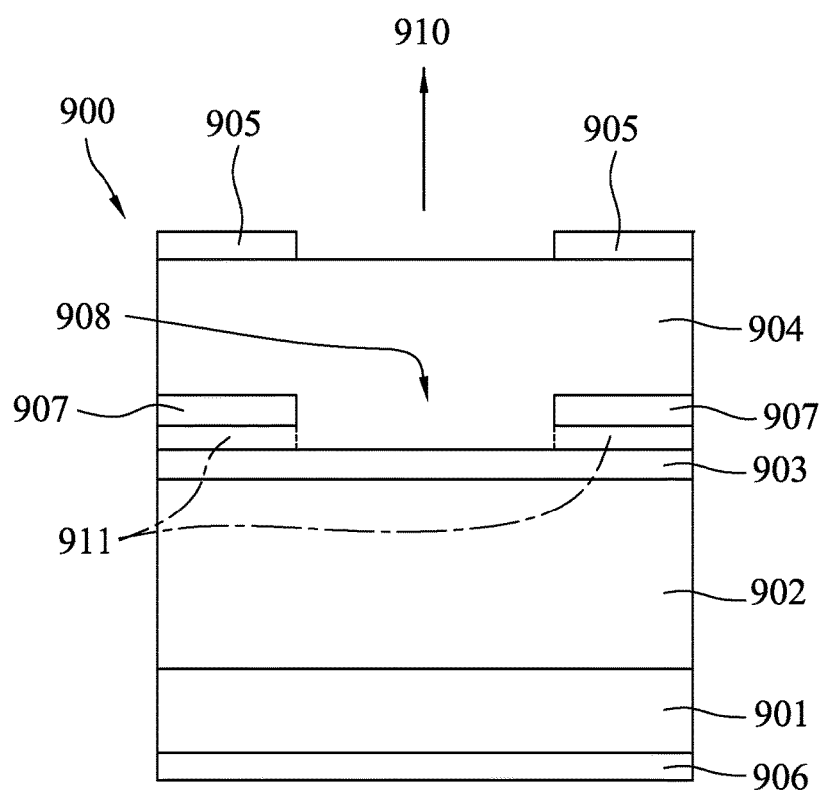
FIG. 1 is a schematic cross-sectional view of a conventional vertical cavity surface emitting laser device.
Figure 2:
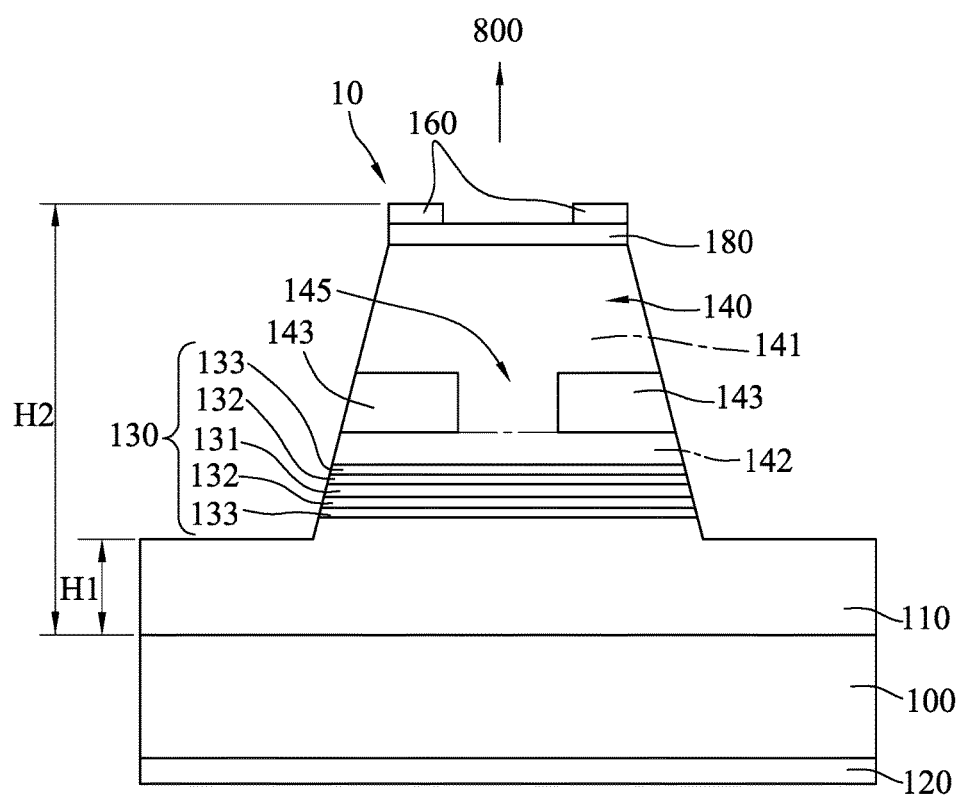
FIG. 2 is a schematic cross-sectional view of an exemplary embodiment of a consumer semiconductor laser according to the present disclosure.

FIG. 2 shows an exemplary embodiment of a consumer semiconductor laser 10 according to the present disclosure. In this embodiment, the consumer semiconductor laser is a vertical cavity surface emitting laser device (VCSEL), and includes a substrate 100, a first-type doped distributed Bragg reflector 110, a first electrode 120, an active layer 130, a second-type doped distributed Bragg reflector 140 and a second electrode 160.

The first-type doped distributed Bragg reflector 110 is disposed on the substrate 100. The first electrode 120 is disposed on the substrate 100. The active layer 130 is disposed on the first-type doped distributed Bragg reflector 110. The second-type doped distributed Bragg reflector 140 is disposed on the active layer 130. The second electrode 160 is disposed on the second-type doped distributed Bragg reflector 140.

Figure 3:
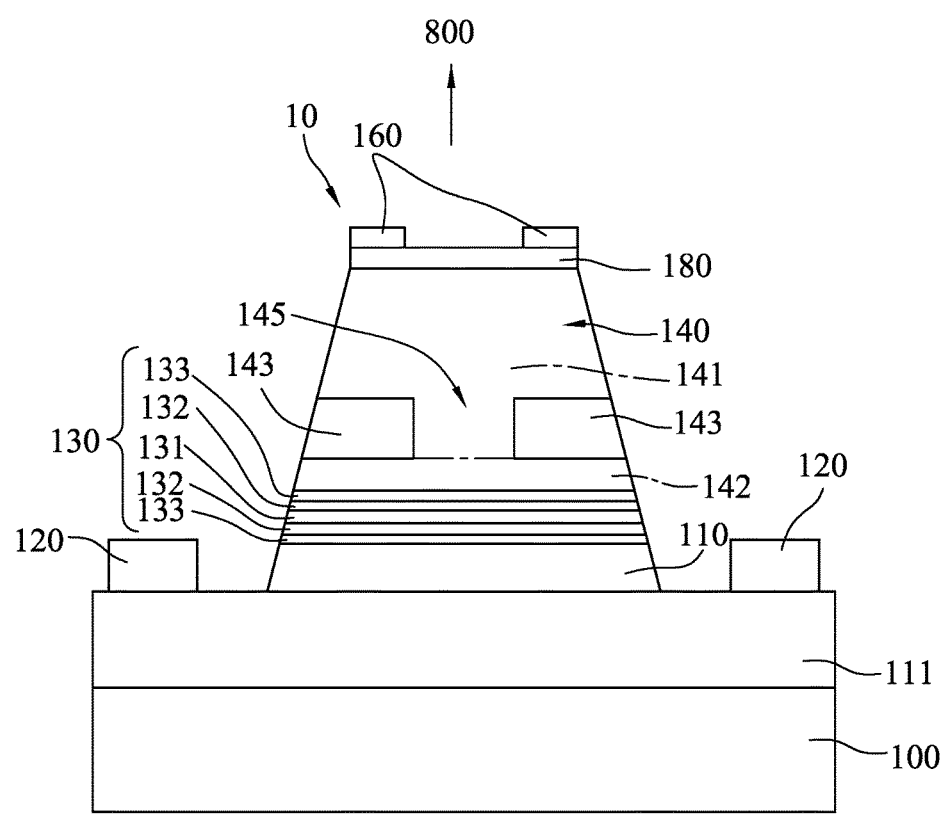
FIG. 3 shows a variation of a first electrode of the embodiment.

In this embodiment, the first electrode 120 is located at the bottom of the substrate 100 opposite to the first-type doped distributed Bragg reflector 110. Alternatively, see FIG. 3, the first electrode 120 may be spaced apart from the first-type doped distributed Bragg reflector 110 and disposed on a doped-buffer layer 111 which is interposed between the first-type doped distributed Bragg reflector 110 and the substrate 100 and which has a doping type the same as that of the first-type doped distributed Bragg reflector 110, as long as an external power source (not shown) can be connected to the first electrode 120 and the second electrode 160 to provide electrical energy to the active layer 130.

The substrate 100 may be n-type, p-type, un-doped or semi-insulating GaAs substrates. In this embodiment, the substrate 100 is a n-type GaAs substrate. The first electrode 120 is made of an electrically conductive material.

The first-type doped distributed Bragg reflector 110 may be a n-type doped distributed Bragg reflector or a p-type doped distributed Bragg reflector, and the second-type doped distributed Bragg reflector 140 has a polarity opposite to that of the first-type doped distributed Bragg reflector 110. In this embodiment, the first-type doped distributed Bragg reflector 110 is the n-type doped distributed Bragg reflector, and the second-type doped distributed Bragg reflector 140 is the p-type doped distributed Bragg reflector. Each of the first-type and second-type doped distributed Bragg reflectors 110, 140 is made of a stack of layers having varying refractive index numbers, and may be made of an aluminum gallium arsenide semiconductor material having a formula of $Al_xGa_{1-x}As$, where x ranges from 0 to 1.

In this embodiment, the active layer 130 includes a quantum well layer 131 made of either GaAs or In GaAs with x ranging from 0.02 to 0.35, and that has a thickness ranging from 2 nm to 12 nm. Alternatively, the active layer 130 may include multiple quantum well layers 131 (i.e., a quantum well layer stack). The active layer 130 further includes two barrier layers 132 that are respectively connected to opposite sides of the quantum well layer 131 to form a double heterostructure. Each of the barrier layers 132 is made of either $Al_xGa_{1-x}As$ (x=0.15-0.4), $GaAs_{1-y}P_y$ (y=0.15-0.3) or GaAs. In certain embodiments, tensile strained $GaAs_{1-y}P_y$ and compressively strained $In_xGaAs$ quantum wells form a strained compensated double heterostructure. Alternatively, the number of the barrier layers 132 may be more than two, and the barrier layers 132 are connected to the opposite sides of the quantum well layer 131 at equal amount. Two separate confinement heterostructure layers 133 are respectively connected to the barrier layers 132 opposite to the quantum well layer 131. Each of the separate confinement heterostructure layers 133 may have a graded index separate confinement heterostructure layer made of $Al_xGaAs$ with x ranging from 0.15 to 0.75, and may have a thickness ranging from 4 nm to 120 nm.

The second-type doped distributed Bragg reflector 140 defines a first doping concentration region 141 and a second doping concentration region 142 disposed between the first doping concentration region 141 and the active layer 130. The second-type doped distributed Bragg reflector 140 further has a confinement member 143 that is formed in the first doping concentration region 141, and that defines an aperture 145. In this embodiment, the aperture 145 has a diameter ranging from 4 μm to 20 μm. The first doping concentration region 141 of the second-type doped distributed Bragg reflector 140 has a doping concentration greater than that of the second doping concentration region 142.

When the first electrode 120 and the second electrode 160 are connected to the external power source, an electrical current flows therebetween and passes through the active layer 130, and the active layer 130 emits a laser beam 800. In this embodiment, the second-type doped distributed Bragg reflector 140 is configured to have a reflectivity less than that of the first-type doped distributed Bragg reflector 110, allowing the laser beam 800 to be upwardly emitted from the consumer semiconductor laser 10. Since the second doping concentration region 142 of the second-type doped distributed Bragg reflector 140 has a lower doping concentration compared to the first doping concentration region 141, current leakage through the second doping concentration region 142 is effectively reduced. In this embodiment, the second doping concentration region 142 is in direct contact with the confinement member 143 and the active layer 130. In other words, besides the second doping concentration region 142, there is no intermediate layer between the confinement member 143 and the active layer 130, so as not to undermine the current leakage prevention capability offered by the second doping concentration region 142. In this embodiment, the first doping concentration region 141 has a doping concentration ranging from $4E18\ cm^{-3}$ to $5E18\ cm^{-3}$, and the second doping concentration region 142 has a doping concentration ranging from $1E18\ cm^{-3}$ to $2E18\ cm^{-3}$, both of which may be changed according to practical requirements as long as the doping concentration of the second doping concentration region 142 is kept lower than that of the first doping concentration region 141. In certain embodiments, the second doping concentration region 142 has a thickness ranging from 260 nm to 780 nm. In certain embodiments, the second doping concentration region 142 has a thickness ranging from 296 nm to 888 nm.

In certain embodiments, the confinement member 143 is made of a proton ion implanted semiconductor material, which is implanted with one of hydrogen ions ($H^+$), helium ions ($He^+$), oxygen ions ($O^+$), and combinations thereof. In certain embodiments, the confinement member 143 is made of only proton implanted AlGaAs/GaAs multilayer stack.

In certain embodiments, the aperture 145 has a diameter ranging from 4 μm to 20 μm, and may be changed according to practical requirements.

In this embodiment, the consumer semiconductor laser 10 further includes a doped layer 180 disposed on the second-type doped distributed Bragg reflector 140 (i.e., disposed between the second electrode 160 and the second-type doped distributed Bragg reflector 140), and having a doping concentration higher than that of the first doping concentration region 141 of the second-type doped distributed Bragg reflector 140. The doped layer 180 is made of GaAs with a thickness of n/4 times emitting wavelength where n is odd natural number excluding zero (i.e., n=1, 3, 5, 7 ... etc.). The doped layer 180 may serve as a top heat dissipation layer upwards from quantum wells for the consumer semiconductor laser 10. In certain embodiments, the first doping concentration region 141 of the second-type doped distributed Bragg reflector 140 has a doping concentration ranging from $4E18\ cm^{-3}$ to $5E18\ cm^{-3}$, and the doped layer 180 has a doping concentration ranging from $1E19\ cm^{-3}$ to $5E19\ cm^{-3}$.

In this embodiment, the second electrode 160 is also made of an electrically conductive material. Therefore, the second electrode 160 in this embodiment is made to have a circular ring shape so as not to block the aperture 145.

Figure 4:
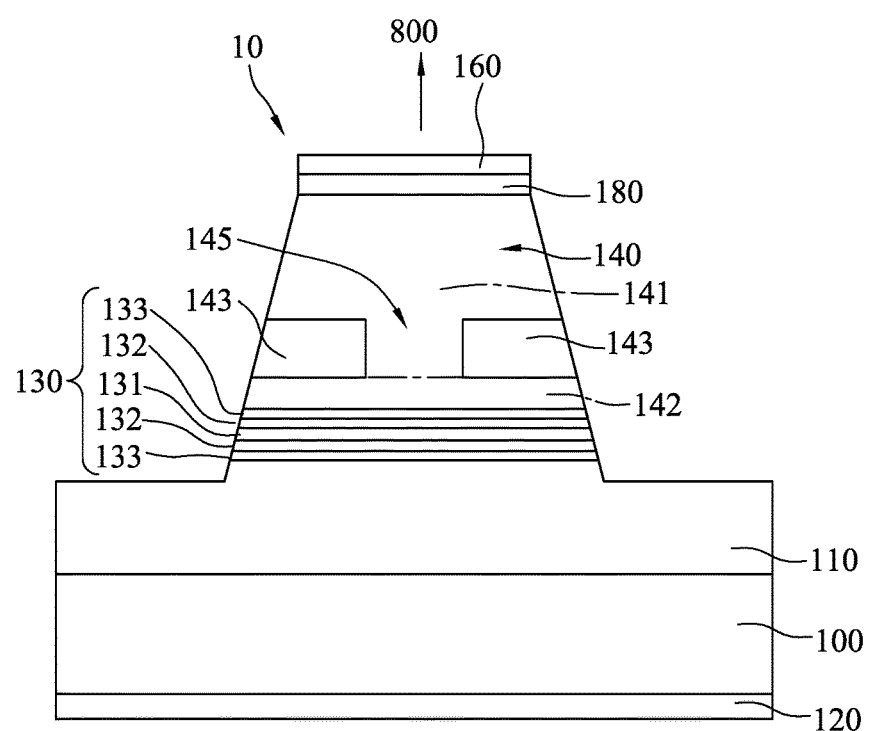
FIG. 4 shows a variation of a second electrode of the embodiment.

Referring to FIG. 4, alternatively, the second electrode 160 may be made of indium tin oxide, which is light-transmittable. Therefore, the second electrode 160 may be made to cover the entire top surface of the second-type doped distributed Bragg reflector 140 opposite to the active layer 130.

Figure 5:
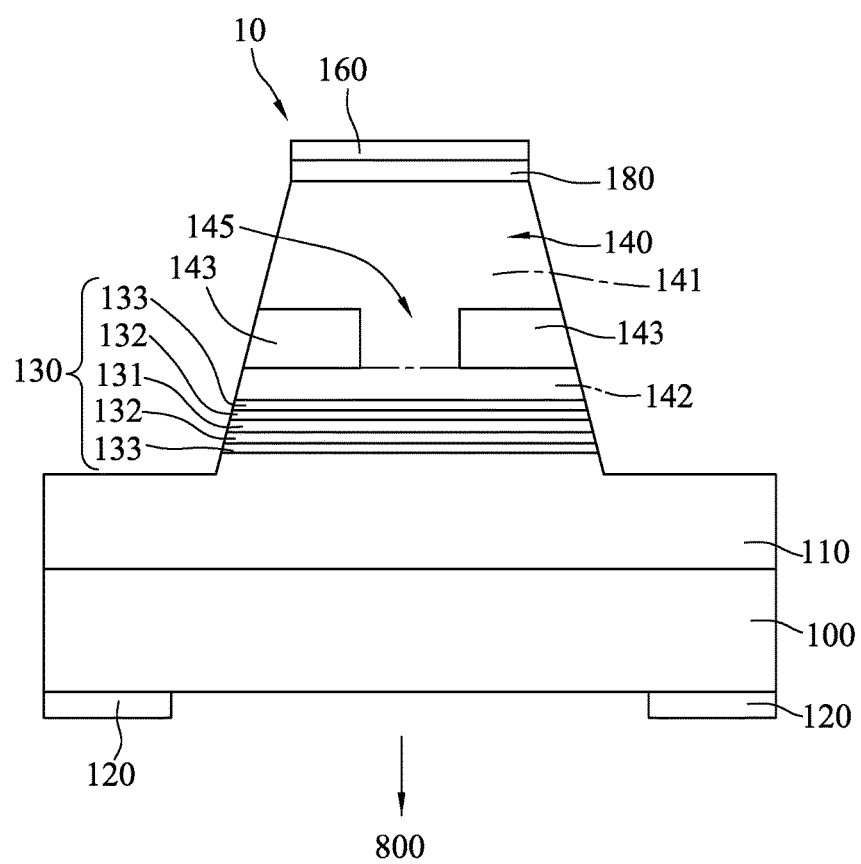
FIG. 5 shows another variation of the first electrode of the embodiment.

Referring to FIG. 5, alternatively, the consumer semiconductor laser 10 may be configured to be a bottom emitting VCSEL. In this embodiment, the first-type doped distributed Bragg reflector 110 is configured to have a reflectivity less than that of the second-type doped distributed Bragg reflector 140, and the first electrode 120 is made to have a circular ring shape, allowing the laser beam 800 to be emitted downwardly from the consumer semiconductor laser 10. It should be noted that the direction of laser beam emission may be changed according to practical applications and thus, the configuration of the second electrode 160 may be the same as those shown in FIGS. 2 and 4 but not limited thereto.

In this embodiment, the consumer semiconductor laser 10 is made to have an angled mesa structure with an angle of 80±10 degree. Specifically, an upper portion of the first-type doped distributed Bragg reflector 110, the active layer 130 and the second-type doped distributed Bragg reflector 140 form the mesa structure that is tapered from the first-type doped distributed Bragg reflector 110 to the second-type doped distributed Bragg reflector 140. In this embodiment, the bottom portion of the mesa structure has a diameter ranging from 20 μm to 48 μm, and the mesa structure has a height ranging from 3.5 μm to 5.5 μm. Such angled mesa structure may be changed according to practical requirements.

Referring back to FIG. 2, in this embodiment, a height (H1) of a portion of the first-type doped distributed Bragg reflector 110, which is not formed into the mesa structure, ranges from 4.5 μm to 5 μm. A height (H2) measured from a top surface of the second electrode 160 to a bottom surface of the first-type doped distributed Bragg reflector 110 ranges from 8 μm to 10.5 μm.

In summary, the consumer semiconductor laser 10 of this disclosure includes the second doping concentration region 142 having a doping concentration less than that of the first doping concentration region 141, thereby effectively reducing current leakage through the second doping concentration region 142. The consumer semiconductor laser 10 of this disclosure has wide range of application, such as proximity sensing, gesture recognition, 3D sensing, time-of-flight sensing, lidar sensing, infrared sensing, etc.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A consumer semiconductor laser comprising:
   a substrate;
   a first-type doped distributed Bragg reflector disposed on said substrate;
   a first electrode disposed on said substrate;
   an active layer disposed on said first-type doped distributed Bragg reflector;
   a second-type doped distributed Bragg reflector disposed on said active layer, and defining a first doping concentration region and a second doping concentration region disposed between said first doping concentration region and said active layer, said second doping concentration region having a doping concentration less than that of said first doping concentration region, said second-type doped distributed Bragg reflector having a confinement member that is formed in said first doping concentration region and that defines an aperture; and
   a second electrode disposed on said second-type doped distributed Bragg reflector.

2. The consumer semiconductor laser as claimed in claim 1, wherein said second doping concentration region has a thickness ranging from 260 nm to 780 nm.

3. The consumer semiconductor laser as claimed in claim 1, wherein said second doping concentration region has a thickness ranging from 296 nm to 888 nm.

4. The consumer semiconductor laser as claimed in claim 1, wherein said confinement member is implanted with one of hydrogen ions, helium ions, oxygen ions, and combinations thereof.

5. The consumer semiconductor laser as claimed in claim 1, wherein said aperture has a diameter ranging from 4 μm to 20 μm.

6. The consumer semiconductor laser as claimed in claim 1, wherein said first electrode is located at the bottom of said substrate.

7. The consumer semiconductor laser as claimed in claim 1, wherein said active layer includes a quantum well layer that includes GaAs and $In_xGaAs$ quantum wells with x ranging from 0.02 to 0.35 and that has a thickness ranging from 2 nm to 12 nm, two barrier layers that are respectively connected to opposite sides of said quantum well layer, and two separate confinement heterostructure layers that are respectively connected to said barrier layers opposite to said quantum well layer and that are made of $Al_xGa_{1-x}As$ with x ranging from 0 to 1, each of said barrier layers being made of one of $Al_xGa_{1-x}As$ with x ranging from 0.15 to 0.4, $GaAs_{1-y}P_y$ with y ranging from 0.15 to 0.3 and GaAs.

8. The consumer semiconductor laser as claimed in claim 7, wherein each of said separate confinement heterostructure layers is a graded index separate confinement heterostructure layer made of $Al_xGaAs$ with x ranging from 0.15 to 0.75, each of said separate confinement heterostructure layers having a thickness ranging from 4 nm to 120 nm.

9. The consumer semiconductor laser as claimed in claim 1, wherein said second electrode is made of indium tin oxide.

10. The consumer semiconductor laser as claimed in claim 9, wherein said second electrode covers a top surface of said second-type doped distributed Bragg reflector opposite to said active layer.

11. The consumer semiconductor laser as claimed in claim 1, further comprising a doped layer disposed on said second-type doped distributed Bragg reflector and having a doping concentration higher than that of said first doping concentration region of said second-type doped distributed Bragg reflector.

12. The consumer semiconductor laser as claimed in claim 11, wherein said doped layer has a thickness that equals to n/4 times a wavelength of a light emitted by said active layer with n being odd natural number excluding zero.

13. The consumer semiconductor laser as claimed in claim 11, wherein said doped layer has a doping concentration ranging from $1E19$ $cm^{-3}$ to $5E19$ $cm^{-3}$.

14. The consumer semiconductor laser as claimed in claim 1, wherein an upper portion of said first-type doped distributed Bragg reflector, said active layer and said second-type doped distributed Bragg reflector form a mesa structure that is tapered with an angle ranging from 70 to 90 degrees from said first-type doped distributed Bragg reflector to said second-type doped distributed Bragg reflector.

15. The consumer semiconductor laser as claimed in claim 1, wherein said substrate is one of n-type GaAs substrate and semi-insulating GaAs substrate.

16. The consumer semiconductor laser as claimed in claim 1, wherein said first doping concentration region has a doping concentration ranging from $4E18$ $cm^{-3}$ to $5E18$ cm$^{-3}$, and said second doping concentration region has a doping concentration ranging from 1E18 cm$^{-3}$ to 2E18 cm$^{-3}$.

17. The consumer semiconductor laser as claimed in claim 1, wherein said confinement member is made of a proton implanted AlGaAs/GaAs multilayer stack.

* * * * *